United States Patent
Han et al.

(10) Patent No.: US 10,326,647 B2
(45) Date of Patent: Jun. 18, 2019

(54) NETWORK-ON-CHIP USING TEMPERATURE-EFFECT-INVERSION AND OPERATION METHOD THEREOF

(71) Applicant: ELECTRONICS AND TELECOMMUNICATIONS RESEARCH INSTITUTE, Daejeon (KR)

(72) Inventors: Kyuseung Han, Sejong (KR); Woojoo Lee, Daejeon (KR); Jae-Jin Lee, Daejeon (KR); Sung Weon Kang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 26 days.

(21) Appl. No.: 15/644,434

(22) Filed: Jul. 7, 2017

(65) Prior Publication Data

US 2018/0109415 A1    Apr. 19, 2018

(30) Foreign Application Priority Data

Oct. 13, 2016  (KR) .......................... 10-2016-0133025
Feb. 22, 2017  (KR) .......................... 10-2017-0023687

(51) Int. Cl.
*H01L 29/78* (2006.01)
*H03K 17/14* (2006.01)
(Continued)

(52) U.S. Cl.
CPC ....... *H04L 41/0803* (2013.01); *H03K 17/145* (2013.01); *H03K 19/0016* (2013.01);
(Continued)

(58) Field of Classification Search
CPC ..................... H04L 41/0803; H04L 41/0672; H04L 43/08
See application file for complete search history.

(56) References Cited

U.S. PATENT DOCUMENTS

| 6,490,082 B2 | 12/2002 | Choi et al. |
| 2007/0160000 A1 | 7/2007 | Dobrowski et al. |

(Continued)

FOREIGN PATENT DOCUMENTS

| JP | 5405123 B2 | 8/2013 |
| KR | 2002-0010772 A | 2/2002 |

(Continued)

OTHER PUBLICATIONS

Kyuseung Han et al., "TEI-NoC: Optimizaing Ultra-Low Power NoCs Exploiting the Temperature Effect Inversion", submitted to the IEEE Transactions on Computer-Aided Design of Integrated Circuits and Systems, 2016, pp. 1-13, IEEE.

(Continued)

*Primary Examiner* — Mohammad S Anwar

(57) ABSTRACT

Provided is a network-on-chip (NoC). The NoC includes a plurality of routers configured to receive power through each corresponding power gating switch, and a controller configured to control a power gating switch of each of the plurality of routers based on temperature information provided from each of the plurality of routers and control a driving clock of the plurality of routers. The controller controls the power gating switch to turn off at least one first router by referring to the temperature information and over-scale a clock frequency of at least one turned-on second router.

17 Claims, 13 Drawing Sheets

(51) Int. Cl.
*H03K 19/00* (2006.01)
*H04L 12/24* (2006.01)
*H04L 12/26* (2006.01)
*H03K 19/003* (2006.01)
*H04L 12/933* (2013.01)

(52) U.S. Cl.
CPC ... *H03K 19/00384* (2013.01); *H04L 41/0672* (2013.01); *H04L 43/08* (2013.01); *H04L 49/101* (2013.01); *H01L 29/785* (2013.01)

(56) References Cited

U.S. PATENT DOCUMENTS

| | | | |
|---|---|---|---|
| 2009/0102534 A1* | 4/2009 | Schmid | G06F 1/04 327/292 |
| 2012/0159496 A1* | 6/2012 | Dighe | G06F 9/4893 718/102 |
| 2012/0175696 A1* | 7/2012 | Franzon | H01L 21/28273 257/316 |
| 2016/0118970 A1 | 4/2016 | Kim et al. | |
| 2017/0222648 A1 | 8/2017 | Lee et al. | |

FOREIGN PATENT DOCUMENTS

| | | |
|---|---|---|
| KR | 10-2016-0049922 A | 5/2016 |
| KR | 10-2017-0092437 A | 8/2017 |

OTHER PUBLICATIONS

Ermao Cai et al., "TEI-Turbo: Temperature Effect Inversion-Aware Turbo Boost for FinFET-Based Multi-Core Systems", ICCAD, Nov. 6, 2015, pp. 500-507, 978-1-4673-8389-9, IEEE.

Woojoo Lee et al., "Dynamic Thermal Management for FinFET-Based Circuits Eploiting the Temperature Effect Inversion Phenomenon", ISLPED'14, Aug. 13, 2014, pp. 105-110, 10.1145/2627369.2627608, ACM.

* cited by examiner

FIG. 10

| Number of power-cut-off routers | | Required frequency (MHz) | |
|---|---|---|---|
| 0 | (0%) | 50 | (x1.0) |
| 4 | (6%) | 60 | (x1.2) |
| 8 | (12%) | 65 | (x1.3) |
| 12 | (18%) | 65 | (x1.3) |
| 16 | (25%) | 70 | (x1.4) |
| 20 | (31%) | 75 | (x1.5) |
| 24 | (38%) | 75 | (x1.5) |
| 28 | (44%) | 90 | (x1.8) |
| 32 | (50%) | Over 100 | N/A |

Algorithm 1 Basic TEI-NoC Power Saving Algorithm

```
 1: procedure DO_TEI_NOC_BASIC
 2:     t_v : target supply voltage
 3:     t_f : target clock frequency
 4:     t_r : set of target routers to turn off
 5:     t_ri: target routing information
 6:     t_p : target power
 7:
 8:     dt ← distribution of temperature
 9:     t_p ← maximum total power
10:     for all v: supply voltage do
11:         for all f: clock frequency do
12:             for all r_pg: set of routers to turn off do
13:                 (b,p,ri) ← FIND_A_SOLUTION(dt,v,f,r_pg)
14:                 if b = 1 and p < t_p then
15:                     (t_v, t_f, t_r, t_ri, t_p) ← (v, f, r_pg, ri, p)
16:                 end if
17:             end for
18:         end for
19:     end for
20:     set voltage and frequency as t_v and t_f
21:     turn off the routers in t_r
22:     reconfigure routing tables of routers as t_ri
23: end procedure
24:
25: function FIND_A_SOLUTION(dt,v,f,r_pg)
26:     b : feasibility
27:     p : power
28:     ri: routing information
29:
30:     b ← 1
31:     f_max ← GET_ALLOWED_MAX_FREQUENCY(dt,r_pg,v)
32:     if f > f_max then
33:         return (0,Φ,Φ)
34:     end if
35:     (b,ri) ← FIND_ROUTING_PATHS(r_pg)
36:     if b = 0 then
37:         return (0,Φ,Φ)
38:     end if
39:     speed ← ESTIMATE_SPEED_UP_RATIO(v,f,r_pg,ri)
40:     if speed < 1 then
41:         return (0,Φ,Φ)
42:     end if
43:     p ← CACULCATE_POWER(dt,r_pg,v,f)
44:     return (b,p,ri)
45: end function
```

| Algorithm 2 Finding Routing Paths Algorithm |
|---|
| 1: function FIND_ROUTING_PATH($r_{pg}$) |
| 2:     $r_{pg}$: set of routers to turn off |
| 3:     b: feasibility |
| 4:     ri: routing information |
| 5: |
| 6:     repeat |
| 7:         for all $node_{src}$: source node do |
| 8:             for all $node_{tgt}$: target node do |
| 9:                 path ← FIND_SINGLE_PATH($r_{pg}$, $node_{src}$, $node_{tgt}$) |
| 10:                 ri ← ri∪path |
| 11:             end for |
| 12:         end for |
| 13:     until enough k iterations are passed |
| 14:     if size(ri) = $n_r^2$ then b ← 1 |
| 15:     else b ← 0 |
| 16:     end if |
| 17:     return (b, ri) |
| 18: end function |
| 19: |
| 20: function FIND_SINGLE_PATH($r_{pg}$, $node_{src}$, $node_{tgt}$) |
| 21:     if $node_{src}$ = $node_{tgt}$ then |
| 22:         d ← node |
| 23:         path ← (d) |
| 24:     else |
| 25:         $path_{cdd}$: candidates of routing path |
| 26:         $path_{cdd}$ ← Φ |
| 27:         for all $node_{adj}$: adjacent nodes do |
| 28:             if there is a path x btw $node_{adj}$ and $node_{tgt}$ then |
| 29:                 d ← direction to $node_{adj}$ |
| 30:                 y ← (d, x) |
| 31:                 $path_{cdd}$ ← $path_{cdd}$ ∪ y |
| 32:             end if |
| 33:         end for |
| 34:         path ← SELECT_BEST_PATH($path_{cdd}$) |
| 35:     end if |
| 36:     return path |
| 37: end function |

FIG. 14

| Algorithm 3 Optimized TEI-NoC Power Saving Algorithm |
| --- |
| 1: procedure DO_TEI_NOC_BASIC |
| 2:     $t_v$ : target supply voltage |
| 3:     $t_f$ : target clock frequency |
| 4:     $t_r$ : set of target routers to turn off |
| 5:     $t_{ri}$ : target routing information |
| 6:     $t_p$ : target power |
| 7:     $list_r$ : sorted list of routers |
| 8: |
| 9:     $dt \leftarrow$ distribution of temperature |
| 10:    $t_p \leftarrow$ maximum total power |
| 11:    $list_r \leftarrow$ SORT_ROUTERS($dt$) |
| 12:    for all $v$ : supply voltage do |
| 13:        for all $f$ : clock frequency do |
| 14:            for all $l$ : number of routers to turn off do |
| 15:                $r_{pg}$ : set of routers to turn off |
| 16:                $r_{pg} \leftarrow$ SELECT_ROUTERS($list_r, l$) |
| 17:                $(b, p, ri) \leftarrow$ FIND_A_SOLUTION($dt, v, f, r_{pg}$) |
| 18:                if $b = 1$ and $p < t_p$ then |
| 19:                    $(t_v, t_f, t_r, t_{ri}, t_p) \leftarrow (v, f, r_{pg}, ri, p)$ |
| 20:                end if |
| 21:            end for |
| 22:        end for |
| 23:    end for |
| 24:    set voltage and frequency as $t_v$ and $t_f$ |
| 25:    turn off the routers in $t_r$ |
| 26:    reconfigure routing tables of routers as $t_{ri}$ |
| 27: end procedure |

NETWORK-ON-CHIP USING TEMPERATURE-EFFECT-INVERSION AND OPERATION METHOD THEREOF

CROSS-REFERENCE TO RELATED APPLICATIONS

This U.S. non-provisional patent application claims priority under 35 U.S.C. § 119 of Korean Patent Application Nos. 10-2016-0133025, filed on Oct. 13, 2016, and 10-2017-0023687, filed on Feb. 22, 2017, the entire contents of which are hereby incorporated by reference.

BACKGROUND

The present disclosure relates to an electronic circuit, and more particularly, to a network-on-chip (NoC) using temperature-effect-inversion and an operation method thereof.

Recently, the number of hardware modules (e.g., Intellectual Property (IP) integrated in a system-on-chip (SoC) is rapidly increasing. Therefore, the importance of communication architecture connecting hardware modules is also increasing. A bus is used as an interconnector inside a SoC. However, the data exchange protocol of the bus is limited in terms of data transmission speed and throughput. A network-on-chip (NoC) for providing a high degree of scalability even with the rapid increase of hardware modules is proposed as a breakthrough to these limitations and is becoming increasingly popular.

However, as the number of hardware modules increases and the communication throughput increases according thereto, the amount of power used by the NoC is known to be 30 to 40% of the total single-chip system. Therefore, in order to reduce the power consumption of the system, reducing the power consumed by the NoC is becoming an important issue.

SUMMARY

The present disclosure provides a network-on-chip (NoC) capable of reducing power consumption by using a temperature-effect-inversion (TEI) phenomenon.

The present disclosure also provides a method for optimizing the configuration of the NoC using the TEI phenomenon.

An embodiment of the inventive concept provides a network-on-chip (NoC) including: a plurality of routers configured to receive power through each corresponding power gating switch; and a controller configured to control a power gating switch of each of the plurality of routers based on temperature information provided from each of the plurality of routers and control a driving clock of the plurality of routers, wherein the controller controls the power gating switch to turn off at least one first router by referring to the temperature information and over-scale a clock frequency of at least one turned-on second router.

In an embodiment, the over-scaled clock frequency may be determined with a value for providing a performance to execute a function of the at least one first router based on a temperature-effect-inversion phenomenon that a signal delay is reduced as a temperature increases.

In an embodiment, each of the plurality of routers may include a temperature sensor for providing the temperature information.

In an embodiment of the inventive concept, an operation method of a network-on-chip (NoC) includes: detecting a temperature of a plurality of routers in the NoC; determining routers to be turned off among the plurality of routers to reduce power consumption based on the detected temperature; and over-scaling a clock frequency of turned-on routers among the plurality of routers to be higher than a value of a design maximum frequency based on the detected temperature, wherein the plurality of routers include a circuit element whose signal delay is reduced as a temperature increases.

In an embodiment, the determining of the routers to be turned off may include preferentially selecting routers at a distance from a center of the NoC.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 10 is a table exemplarily illustrating a frequency over-scaling technique of the inventive concept;

FIG. 12 is a view illustrating a PGFOS algorithm for reducing the power consumption of an NoC using the TEI phenomenon of the inventive concept;

FIG. 13 is a view exemplarily illustrating an operation of the function 'FIND_ROUTING_PATHS (rpg)' for finding the optimal routing path mentioned with reference to FIG. 12; and FIG. 14 is a view illustrating a PGFOS algorithm for reducing the power consumption of an NoC using the TEI phenomenon.

DETAILED DESCRIPTION

Figure 1:
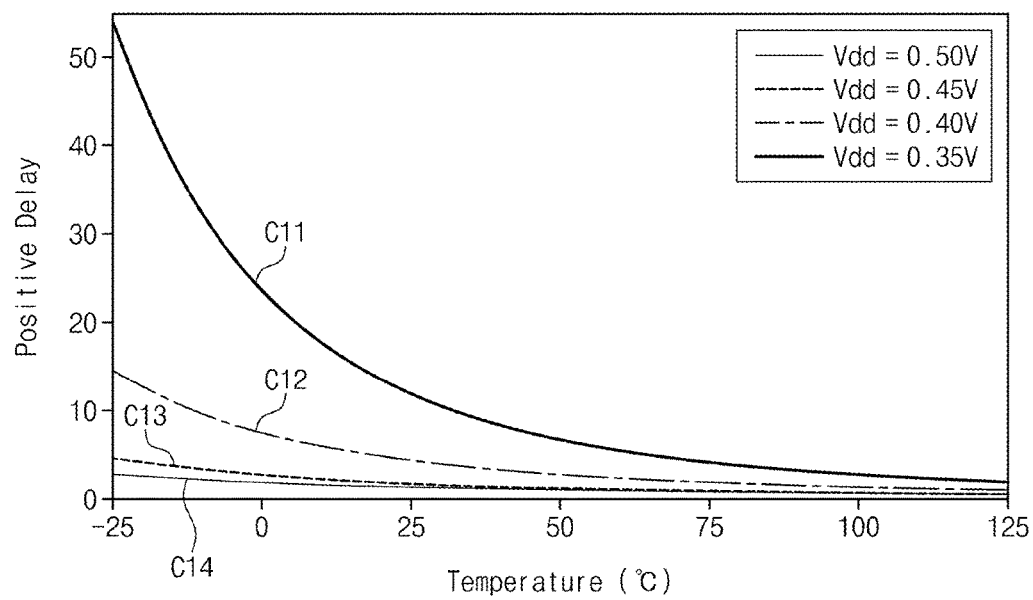
FIGS. 1 and 2 are graphs illustrating a temperature-effect-inversion phenomenon.

Hereinafter, embodiments of the inventive concept will be described in more detail with reference to the accompanying drawings. In the description below, details such as detailed configurations and structures are simply provided to help overall understanding. Therefore, without departing from the technical idea and scope of the inventive concept, modifications on embodiments described in this specification may be performed by those skilled in the art. Furthermore, description of well-known functions and structures are omitted for clarity and conciseness. The terms used herein are defined in consideration of functions of the inventive concept and are not limited to specific functions. The definition of terms may be determined based on the details in description.

Modules in drawings or detailed description below may be shown in the drawings or may be connected to another component other than components described in detailed description. Each of connections between modules or components may be direct or indirect. Each of connections between modules or components may be a connection by communication or a physical access.

Components described with reference to terms such as parts, units, modules, and layers used in detailed description may be implemented in software, hardware, or a combination thereof. Exemplarily, software may be machine code, firmware, embedded code, and application software. For example, hardware may include an electrical circuit, an electronic circuit, a processor, a computer, an integrated circuit, integrated circuit cores, a pressure sensor, an inertial sensor, microelectromechanical systems (MEMS), a passive device, or a combination thereof.

Unless otherwise defined, all terms including technical or scientific meanings used in the specification have meanings understood by those skilled in the art. In general, the terms defined in the dictionary are interpreted to have the same meanings as contextual meanings and unless they are clearly defined in the specification, are not to be interpreted to have ideal or excessively formal meanings.

Figure 2:
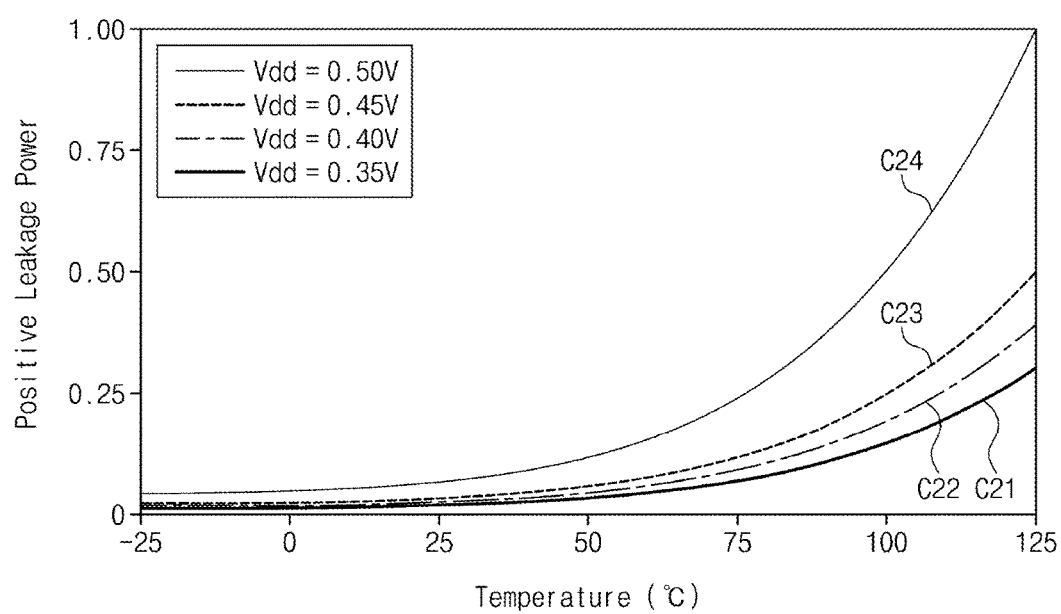

FIGS. 1 and 2 are graphs illustrating a temperature-effect-inversion phenomenon. FIG. 1 is a graph showing a relationship between a temperature and a delay of a semiconductor circuit, and FIG. 2 is a graph showing a magnitude relation between a temperature and a power in a semiconductor circuit.

A temperature-effect-inversion (TEI) phenomenon is a phenomenon in which a relationship between a temperature and a delay in a semiconductor circuit appears to be contrary to what is generally known. Generally, the TEI phenomenon occurs in MOSFET-based circuits, circuits driven by ultra-low voltage (ULV) that is below 1 V, or circuits based on Fin-Field Effect Transistors (FinFETs) that are from a next-generation semiconductor process. In a typical circuit, as a temperature becomes higher, a delay increased, so that the speed of a circuit decreases. However, in the above-mentioned ultra-low voltage circuit or FinFET circuit, as a temperature increases, a delay decreases, so that as a result, a phenomenon that the speed of the circuit increases occurs. In the inventive concept, such a TEI phenomenon will be used as an alternative to realize low power consumption without decreasing the performance of a network-on-chip (NoC).

Referring to FIG. 1, the relative characteristics of a temperature and a delay for each driving voltage Vdd of the circuit are shown by a plurality of curves C11, C12, C13, and C14. Referring to the curve C11 showing the magnitude of a delay according to a temperature at the driving voltage (Vdd=0.35 V), a change in the magnitude of a delay according to a temperature is hardly observed at a temperature of 100° C. However, at 25° C. or lower, a change in the magnitude of a delay according to a temperature increases. Referring to the curve C12 showing the magnitude of a delay according to a temperature at the driving voltage (Vdd=0.40 V), a change in the magnitude of a delay according to a temperature is observed at a temperature of 50° C. Such characteristics are remarkably observed as the magnitude of the driving voltage Vdd is lower.

The above-described magnitude characteristic of a delay according to a temperature means that if the driving temperature of the circuit rises, the performance of the circuit may be kept constant by scaling down the driving voltage Vdd. Also, in an ultra-low voltage circuit, as a temperature becomes higher, a delay decreases, and therefore, this means that the performance may be improved by providing a higher driving clock frequency of the circuit.

Referring to FIG. 2, the relative characteristics of a temperature and a power consumption for each driving voltage Vdd of the circuit are shown by a plurality of curves C21, C22, C23, and C24. Referring to the curve C21 showing the magnitude of a power consumption according to a temperature at the driving voltage (Vdd=0.35 V), as a temperature rises, power consumption increases. However, the curve C21 has a smaller increase in power than the curve C24 showing the magnitude of a power consumption according to a temperature at the driving voltage (Vdd=0.50). This means that the increase of the relative power consumption is not large even if the temperature is increased in the ultra low voltage circuit.

In the inventive concept, a technique for reducing the power of an NoC that consumes a relatively large amount of power in the chip by using the TEI phenomenon described above will be provided.

Figure 3:
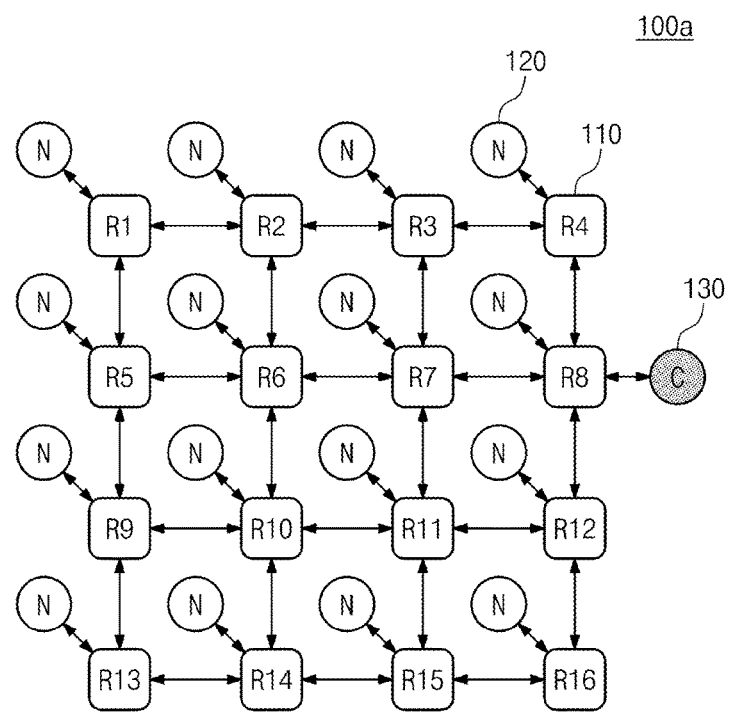
FIG. 3 is a view illustrating a topology of a network-on-chip (NoC) according to an embodiment of the inventive concept.

FIG. 3 is a view illustrating a topology of an NoC according to an embodiment of the inventive concept. Referring to FIG. 3, an NoC 100a according to an embodiment of the inventive concept includes a plurality of routers R1 to R16 and at least one controller 130. A node 120 does not constitute a network, but is illustrated for describing the effect of the inventive concept.

The node 120 connected to the plurality of routers R1 to R16 may be, for example, hardware blocks (e.g., IPs) having a specific function. Then, each of the plurality of routers R1 to R16 may detect the driving temperature in real time and transmit it through the network. For this, each of the plurality of routers R1 to R16 will include a temperature sensor. The temperature information sensed by each of the plurality of routers R1 to R16 may be transmitted to the controller 130 together with identification information of the transmitting router.

The controller 130 may analyze temperature information of the plurality of routers R1 to R16, which is delivered in real time or periodically via the network. Then, the controller 130 may determine the degree of the TEI phenomenon by using the analyzed information. The controller 130 adjusts a power gating for blocking the powers of some of the plurality of routers R1 to R16 based on the determined information. Then, frequency scaling may be performed for optimum performance in the adjusted power gating state. In addition, it will be understood well that voltage scaling may be used for optimal performance. The voltage scaling may be performed by a power domain unit and the frequency scaling may be performed by a frequency domain unit.

The controller 130 of the inventive concept may select optimal communication paths using the temperature information of the plurality of routers R1 to R16. That is, the power gating may be performed in such a manner that the power of the routers not on the optimal communication path is cut off. Then, the controller 130 may perform frequency scaling or voltage scaling to contribute the gain of the power provided through the power gating to increasing the operating speed of the selected routers. The power gating, voltage or frequency scaling method of an NoC using such a TEI phenomenon will be described in detail with reference to the following drawings.

According to the above-mentioned configuration of the NoC in the drawings, the controller 130 may be connected to at least one of the plurality of routers R1 to R16. The router to which the controller 130 is connected may be one having the optimal connection condition among the plurality of routers R1 to R16. In this case, the controller 130 may be implemented as a hardware block (e.g., IP) having a dedicated function.

Figure 4:
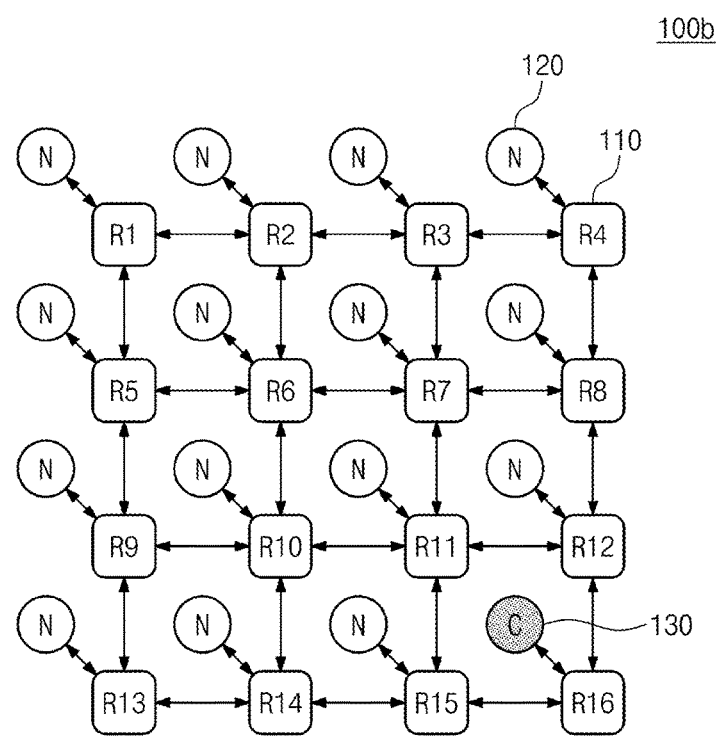
FIG. 4 is a view illustrating a topology of an NoC according to an another embodiment of the inventive concept.

FIG. 4 is a view illustrating a topology of an NoC according to another embodiment of the inventive concept. Referring to FIG. 4, an NoC 100b according to another embodiment of the inventive concept includes a plurality of routers R1 to R16 and at least one controller 130. The controller 130 may be implemented using an already existing node. The plurality of routers R1 to R16 include a temperature sensor, and transmit sensed temperature information to the controller 130 in real time or periodically.

The controller 130 may select optimal communication paths using the temperature information provided from the plurality of routers R1 to R16. That is, the controller 130 may perform power gating in such a manner that the power of the routers not on the optimal communication path is cut off. Then, the controller 130 may perform frequency scaling or voltage scaling to contribute the gain of the power provided through the power gating to increasing the operating speed of the selected routers.

According to the above-mentioned configuration of the NoC 100b in the drawings, the controller 130 may be implemented using any one of the nodes connected to the plurality of routers R1 to R16. In this case, the controller 130 of the inventive concept may be implemented in software that defines any one of the operations to implement the controller 130.

Through the above FIGS. 3 and 4, an exemplary topology of the NoC 100 of the inventive concept is described. However, there is no topology limitation in implementing the NoC 100 of the inventive concept. In the above-described example, a TEI-NoC is configured by adding a controller to the NoC of a 4×4 2D Mesh structure. However, the shape of an NoC may be configured without limitation of dimensions such as 1D, 2D, and 3D. In addition, the inventive concept may be implemented in a topology of an NoC in the form of a ring, a torus, and a tree. It will be understood well that the implementation of the NoC in FIGS. 3 and 4 is possible regardless of the size, such as 8×8 or 16×16 rather than 4×4.

Figure 5:
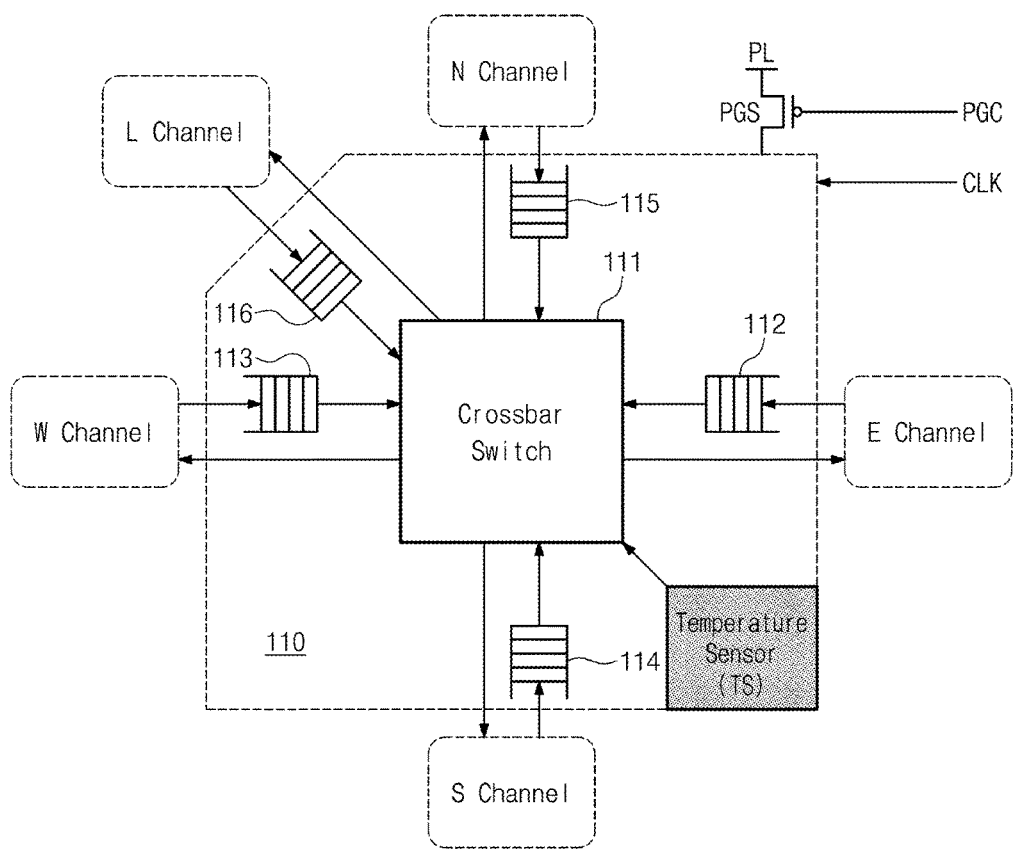
FIG. 5 is a schematic block diagram illustrating an exemplary structure of a router according to an embodiment of the inventive concept.

FIG. 5 is a schematic block diagram illustrating an exemplary structure of a router according to an embodiment of the inventive concept. Referring to FIG. 5, a router 110 may include a crossbar switch 111, and input buffers 112, 1113, 114, 115, and 116. In addition, it may include a temperature sensor 118 for detecting the TEI phenomenon of the inventive concept. The router 110 may further include a power gating switch PGS for cutting off power from a power line PL in response to the power gating signal PGC. Then, the router 110 will operate in response to the clock signal CLK of a scaled frequency.

The crossbar switch 111 delivers data received by the input buffers 112, 1113, 114, 115, and 116 to the output terminal according to a routing policy. The switching of the input/output terminals may be scheduled through a crossbar scheduler (not shown) although not shown. The crossbar scheduler may be implemented with various scheduling algorithms depending on the application. For example, the crossbar scheduler may use a round-robin algorithm that universally values fairness as a top priority. Alternatively, the crossbar scheduler may use a Fixed-Priority algorithm that follows a predefined priority.

The input buffers 112, 1113, 114, 115, and 116 buffer the data provided from a plurality of channels E, W, S, N, and L. Data stored in the input buffers 112, 1113, 114, 115, and 116 will be delivered to the channel selected by the crossbar switch 111.

The temperature sensor 118 senses the temperature of the specific position of the NoC 100. In particular, the temperature sensor 118 senses the temperature of the local area where the router 110 is located. The temperature sensor 118 transmits periodically the sensed temperature information to the controller 130 through the crossbar switch 111. At this time, the transmitted temperature information will include the identification information of the corresponding router 110. The temperature sensor 118 may, for example, use a thermoelectric (or thermocouple) sensor using an electromotive force that varies with temperature, and a thermoelectric sensor for sensing the magnitude of resistance that varies with temperature. However, it will be understood well that the temperature measuring method of the temperature sensor 118 is not limited to this and may be variously applied.

The power gating switch PGS cuts off the power of the router 110 in response to the power gating control signal PGC provided from the controller 130. The power gating switch PGS may be included in all the routers constituting the NoC 100. Then, the power gating switch PGS of each of the routers may be controlled by the controller 130. Although the power gating switch PGS is shown as a PMOS transistor, the inventive concept is not limited thereto. It will be understood well that the power gating switch PGS may be implemented through various switching elements.

Figure 6:
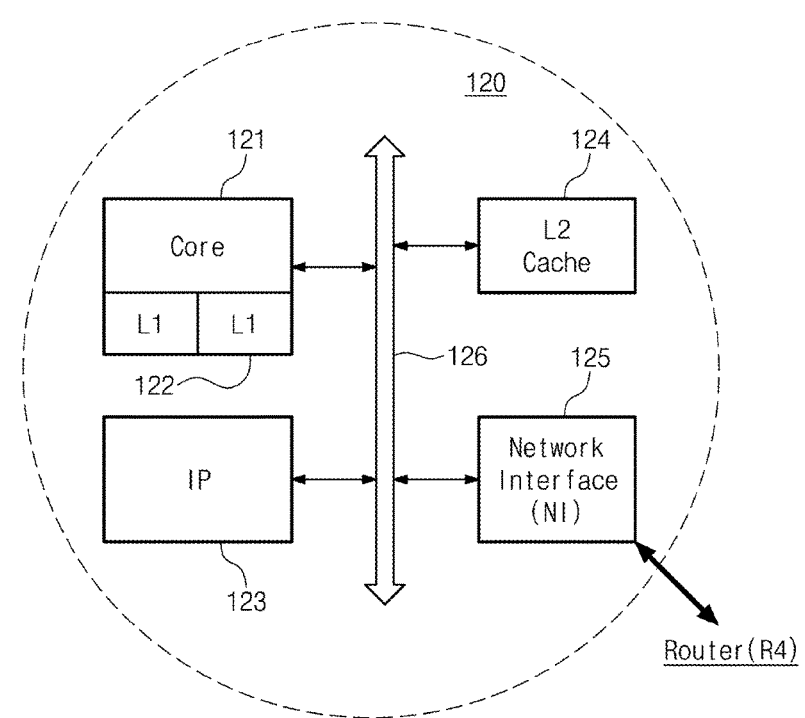
FIG. 6 is a block diagram illustrating a structure of a node shown in FIG. 3 or 4.

FIG. 6 is a block diagram illustrating a structure of a node shown in FIG. 3 or 4. Referring to FIG. 6, the node 120 may be configured using a processor including a functional block (e.g., IP) or a plurality of functional blocks. For example, the node 120 may include a core 121, an L1 cache 122, an IP 123, an L2 cache 124, a network interface 125, and a bus 126.

The core 121, the L1 caches 122, and the L2 cache 124 may process tasks that are requested to be processed. The core 121 may process various tasks requested to be processed through the network interface 125 and output them through the network interface 125. The outputted data will be provided as a target node through the router 110. The IP 123 may be provided to have functions corresponding to various purposes. The node 120 is not included in the configuration of an NoC of the present invention. Also, since a node is separately managed from the voltage and frequency scaling of routers, a detailed description of the node will be omitted.

However, in the structure of the NoC 100b with the topology described with reference to FIG. 4, the functions of the controller 110 of the inventive concept may be performed through software loaded to the node 120.

Figure 7:
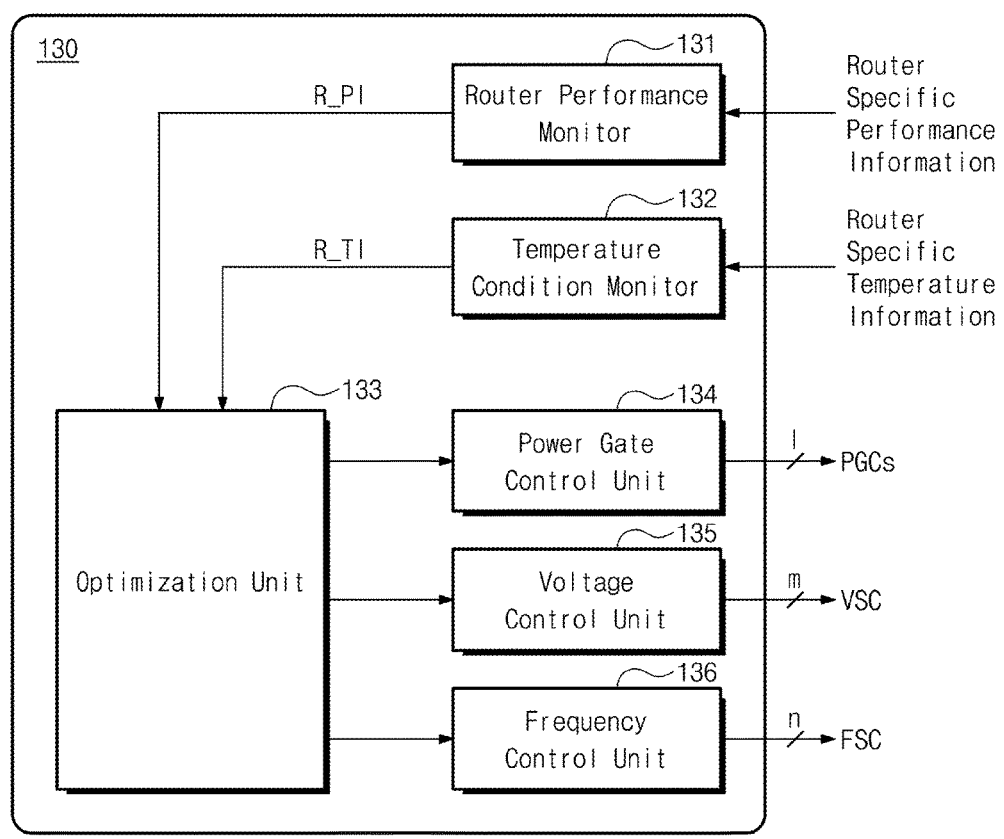
FIG. 7 is a schematic block diagram illustrating a structure of a controller according to an embodiment of the inventive concept.

FIG. 7 is a schematic block diagram illustrating a structure of a controller according to an embodiment of the inventive concept. Referring to FIG. 7, a controller 130 includes a router performance monitor 131, a temperature condition monitor 132, an optimization unit 133, a power gate control unit 134, a voltage control unit 135, and a frequency control unit 136.

The router performance monitor 131 receives performance information transmitted from each of the routers. The router performance monitor 131 may receive feedback on the performance of routers selected by the optimization unit 133 and having adjusted voltage and frequency. The router performance monitor 131 may collect and combine the performance of each of the feedback-received routers to generate router performance information R_PI. The generated router performance information R_PI will be provided to the optimization unit 133.

The temperature condition monitor 132 receives temperature information of each of the routers. The location of each of the routers includes a corresponding temperature sensor. Accordingly, the temperature condition monitor 132 receives the temperature information of each of the router and provides it to the optimization unit 133 as the router temperature information R_TI. The temperature condition monitor 132 may receive the temperature information provided from the temperature sensors in real time, but may periodically receive the temperature information.

The optimization unit 133 performs power control and performance control of an NoC using the temperature information of each of the routers. That is, the optimization unit 133 may determine the temperature distribution of a chip or an NoC using the temperature information of each of the routers. If the temperature distribution of the chip is known, the degree of TEI of the routers constituting the NoC may be detected from the temperature information of each of the routers. And the optimization unit 133 controls the power gate control unit 134 to block the power of specific routers using the detected results. Next, the optimization unit 133 will control the voltage control unit 135 or the frequency control unit 136 to control the operating speed of the routers constituting a virtual channel. The power cutoff, voltage or frequency determination operation of the routers considering the TEI phenomenon by the optimization unit 133 will be described in detail with reference to the following drawings.

The optimization unit 133 may detect the degree of TEI using the chip temperature distribution. Also the optimization unit 133 may control the power gate control unit 134 to cut off the power of specific routers using the detection result. Alternatively, the optimization unit 133 may control the voltage control unit 136 or the frequency control unit 136 to increase or decrease the operating speed of a specific portion of the routers in a manner that controls a power domain and a clock domain.

The power domain and the clock domain are determined when designing an NoC or a chip including the same, and the optimization unit 133 may control voltage and frequency in power domain and clock domain units. However, it will be understood well that the optimization unit 133 may control a level of clock frequency or driving voltage of individual routers other than a power domain or clock domain unit. The optimization unit 133 will notify the power gate control unit 134, the voltage control unit 135, and the frequency control unit 136 to set an NoC to be in a determined status. Then, the optimization unit 133 may receive feedback on the performance of the NoC after the setting through the router performance monitor 131.

The power gate control unit 134 disconnects or connects the power of the routers constituting the NoC according to the determination of the optimization unit 133. That is, the power gate control unit 134 may control the power gating switch of the selected routers to turn off the selected routers. For example, the power gate control unit 134 may individually switch the power gating switches PSG of each of the routers constituting the NoC. Alternatively, the power gate control unit 134 may control the power gating switch PGS of the routers in a predetermined zone unit. The number of power gate control signals PGSs provided by the power gate control unit 134 is represented by I (I is a natural number).

The voltage control unit 135 may scale the voltage supplied to the routers constituting the virtual channel according to the TEI phenomenon. Since the turned-on routers should perform tasks that the turned-off routers are not able to perform, the voltage control unit 135 may increase the operating speed by raising the voltages of the routers maintained in the turned-on status. A voltage control signal VSC provided by the voltage control unit 135 may be outputted as m (m is a natural number) corresponding to the number of power domains.

The frequency controller 136 may scale the frequency of a clock signal supplied to the routers constituting the virtual channel according to the TEI phenomenon. Since the turned-on routers should perform tasks that the turned-off routers are not able to perform, the frequency control unit 136 may increase the clock frequency of the routers maintained in a turned-on status when the TEI phenomenon is used. The frequency at this time will be provided as a frequency higher than a frequency determined at the time of designing the router. Such a clock frequency control method of the frequency control unit 136 will be referred to as frequency over-scaling (FOS). The frequency control signal FSC of a clock generated by the frequency control unit 136 may be provided as n (n is a natural number) corresponding to the number of clock domains.

Voltage scaling (VS) or frequency over-scaling (FOS) may be performed to power off specific routers using the TEI phenomenon of the inventive concept and to maximize the performance of unblocked routers.

Figure 8:
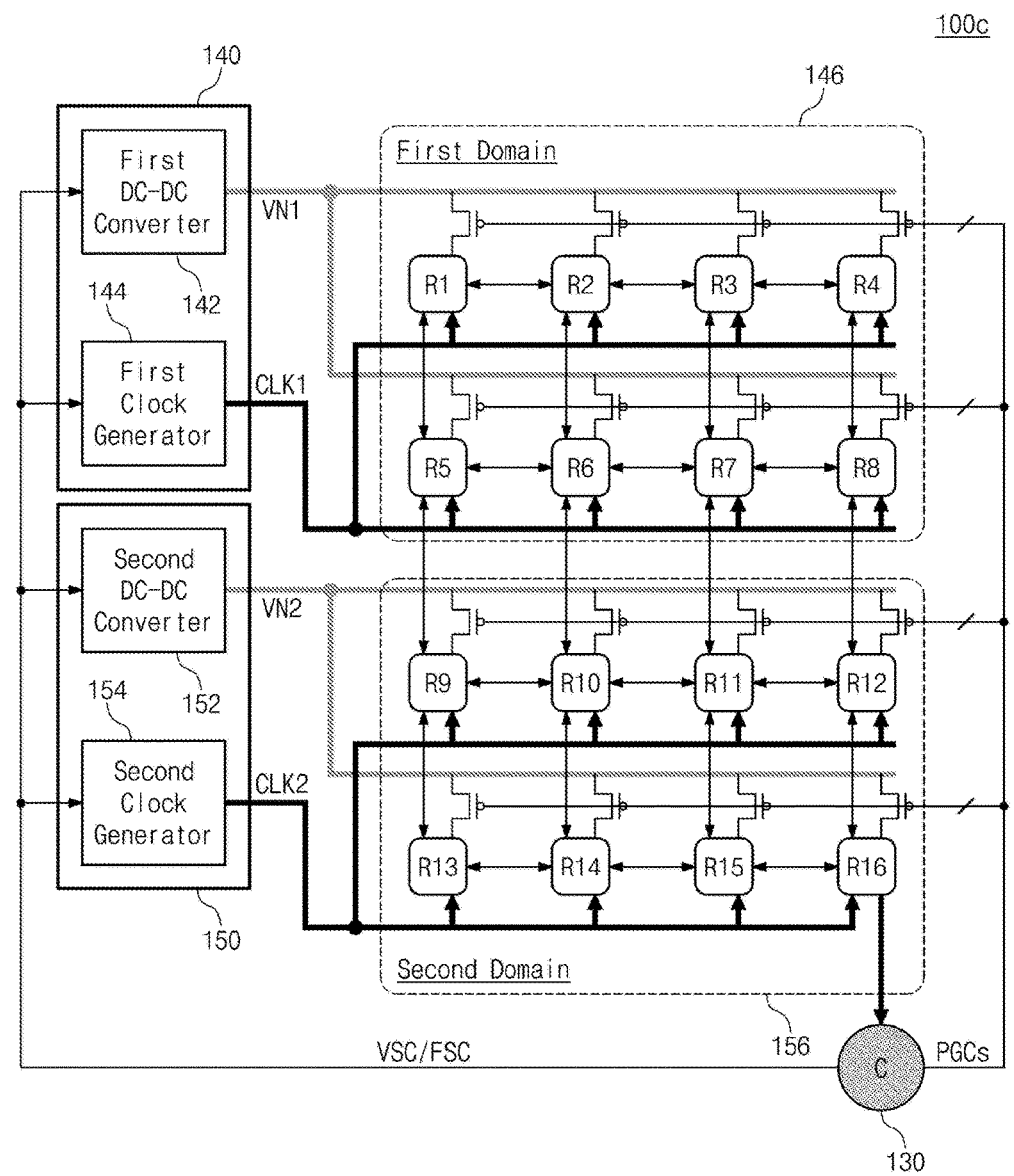
FIG. 8 is a block diagram exemplarily illustrating a method of applying power gating (PG), voltage scaling (VS), and frequency over-scaling (FOS) of an NoC of the inventive concept.

FIG. 8 is a block diagram exemplarily illustrating a method of applying power gating (PG), voltage scaling (VS), and frequency over-scaling (FOS) of an NoC of the inventive concept. Referring to FIG. 8, a controller 130 may perform power gating and frequency over-scaling simultaneously to maintain or increase the performance even if power is reduced by using the TEI phenomenon. Such an operation is hereinafter referred to as Power Gating with Frequency Over-Scaling (PGFOS).

The controller 130 will first generate power gating control signals PGSs for powering off the determined routers with reference to the TEI phenomenon. And the controller 130 will use the generated power gating control signals PGSs to control the power gating switch PGS of each of the routers. Then, some routers will be turned off except routers constituting an optimal virtual channel, which are selected to reduce power consumption.

The controller 130 then outputs a voltage control signal VSC and a frequency control signal FSC for controlling the voltage and the clock frequency of the routers maintained in a turned-on status, in a domain unit. The power domain and the frequency domain may be allocated differently. However, for convenience of description, it is assumed that the same area is allocated in the inventive concept. For example, the routers may be separated into a first domain 146 and a second domain 156 and voltage and clock frequency may be provided thereto.

They may be regarded as the first frequency domain and the first power domain of the first domain 146. That is, the voltage provided to the routers R1 to R8 of the first domain 146 is generated from the first DC-DC converter 142. Therefore, the first power source voltage VN1 provided by the first DC-DC converter 142 will be provided to the routers maintained in a turned-on status among the routers R1 to R8 of the first domain 146. A first driving clock CLK1 provided to the routers R1 to R8 of the first domain 146 is generated from the first clock generator 144.

They may be regarded as the second frequency domain and the second power domain of the second domain 156. That is, the voltage provided to the routers R9 to R16 of the second domain 156 is generated from the second DC-DC converter 152. Therefore, the second power source voltage VN2 provided by the second DC-DC converter 152 will be provided to the routers maintained in a turned-on status among the routers R9 to R16 of the second domain 156. A second driving clock CLK2 provided to the routers R9 to R16 of the second domain 156 is generated from the first clock generator 154.

The controller 130 will control the frequency of the voltage or the driving clock in a domain unit in order to improve the performance of the selected routers by referring to the TEI phenomenon. In order to increase the voltage of the first domain 146, the controller 130 controls to generate a high level of the driving voltage VN1 using the voltage control signal VSC provided to the first DC-DC converter 142. In the same manner, the controller 130 may control the second clock generator 154 to increase the frequency of a clock signal to the target level, in order to detect the TEI phenomenon and increase the clock frequency of the routers selected from the second domain 156.

According to the above-mentioned characteristic of the controller 130 of the inventive concept, Power Gating with Frequency Over-Scaling (PGFOS) using the TEI phenomenon may be performed. When the TEI phenomenon is detected among the routers, optimal routers that are turned off to utilize the detected routers are selected. And the voltage or frequency for yielding optimum performance may be derived through the turned-on routers. In order for the turned-on routers to be able to handle the tasks of the turn-off routers, the maximum band frequency using the TEI phenomenon may be set. Thus, according to the PGFOS of the inventive concept, the tasks to be handled by the turned-off routers may be processed through frequency over-scaling of routers in a turned-on status. Thus, if power gating and frequency over-scaling are used with the TEI phenomenon of the inventive concept, power consumption may be increased without degrading performance. Alternatively, if power gating and frequency over-scaling are used with the TEI phenomenon of the inventive concept, the performance of an NoC may be improved without increasing power consumption.

Figure 9:
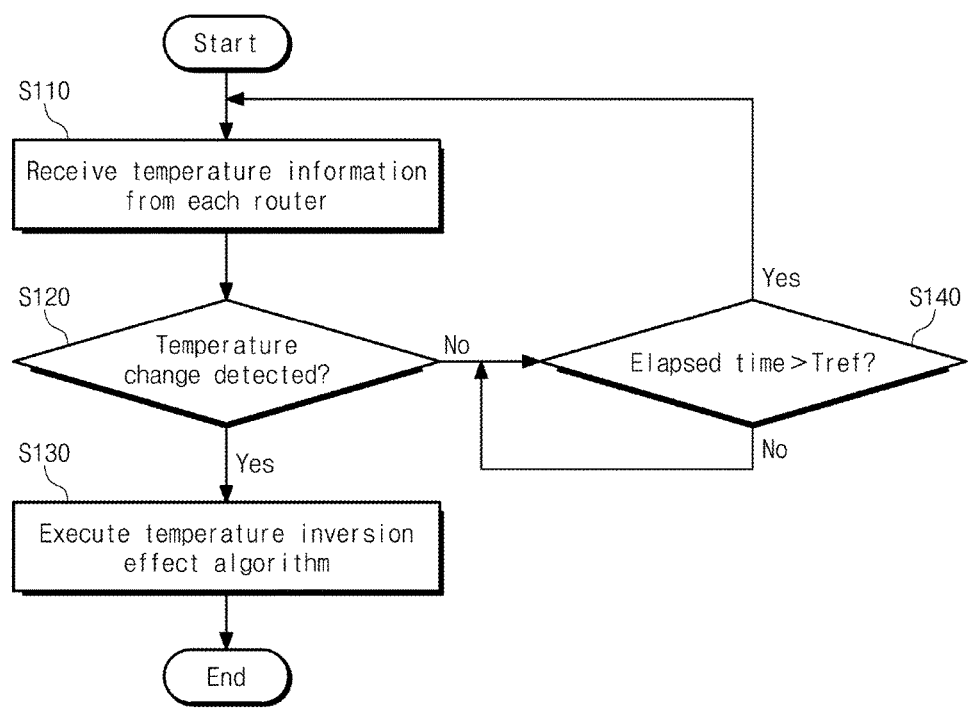
FIG. 9 is a flowchart briefly illustrating a power gating and frequency over-scaling method utilizing the TEI phenomenon of the inventive concept.

FIG. 9 is a flowchart briefly illustrating a power gating and frequency over-scaling method utilizing the TEI phenomenon of the inventive concept. Referring to FIG. 9, a macro PGFOS operation performed by the controller 130 of the inventive concept is illustrated exemplarily.

In operation S110, the controller 130 (see FIG. 8) or more specifically, the optimization unit 133 in the controller 130 receives temperature information provided from each of the routers of an NoC. As described above, each of the routers of the NoC is provided with a temperature sensor 118 (see FIG. 5). Temperature information obtained in real time by the temperature sensor 118 provided in each of the routers is delivered to the controller 130. Then, the temperature condition monitor 132 of the controller 130 collects and combines the temperature information and transmits it to the optimization unit 133.

In operation S120, the optimization unit 133 determines whether there is a change in the current temperature of each of the routers of the NoC. If it is determined that there is no further temperature change in the voltage and frequency status set by the previous PGFOS operation (No direction), the procedure moves to operation S140. Contrary, if it is determined that there is an additional temperature change in the voltage and frequency status set by the previous PGFOS operation (Yes direction), the procedure moves to operation S130.

In operation S130, the optimization unit 133 performs an optimization operation to perform the power gating, voltage scaling, and frequency scaling of the NoC using the TEI phenomenon. This optimization operation will be referred to as a TEI algorithm. That is, the optimization unit 133 uses the TEI phenomenon to reduce the power consumption of the routers and perform an optimization operation to find optimal parameters for maximizing the performance of some routers. The, the optimization unit 133 controls the power gate control unit 134, the voltage control unit 135, and the frequency control unit 136 to generate the power gating, voltage and clock frequency of the routers generated as a result of the optimization operation.

In operation S140, the optimization unit 133 will receive temperature information at regular intervals because there is no temperature change in the voltage and frequency status set by the previous PGFOS cycle. That is, the optimization unit 133 will determine whether the elapsed time exceeds a reference time Tref in order to receive again the temperature information obtained in real time. If the elapsed time does not exceed the reference time Tref (No direction), the procedure waits. On the other hand, if the elapsed time exceeds the reference time Tref (Yes direction), the procedure returns to operation S110 to receive the temperature information obtained in real time again.

Once the power gating, voltage, and clock frequency of routers generated as a result of the optimization operation are set, one control cycle for utilizing the TEI is completed. However, as such a control cycle continues to be repeated, the optimum conditions will change according to a temperature change.

FIG. 10 is a table exemplarily illustrating a frequency over-scaling technique of the inventive concept. Referring to FIG. 10, a relationship between power gating and frequency over-scaling for maintaining the performance of an NoC is shown exemplarily. Here, it is assumed that the number of routers is 64, and the maximum frequency of the router defined at the time of designing is 50 MHz.

If there is no (zero) number of routers that are powered off by power gating, frequency over-scaling does not need to be performed. That is, the performance is maintained even if all 64 routers where power is supplied are driven at 50 MHz.

On the other hand, if four routers (6%) among all routers are turned off by power gating, the remaining routers (60) should be over-scaled to 60 MHz in order to maintain the performance. In such a manner, if 24 gateways (38%) are turned off by power gating, the remaining routers should be over-scaled to a clock frequency of 75 MHz to maintain the performance.

In the inventive concept, by using frequency over-scaling to maintain such performance, power gating and frequency over-scaling (PGFOS) may be performed to maintain the performance despite reduced power.

Figure 11:
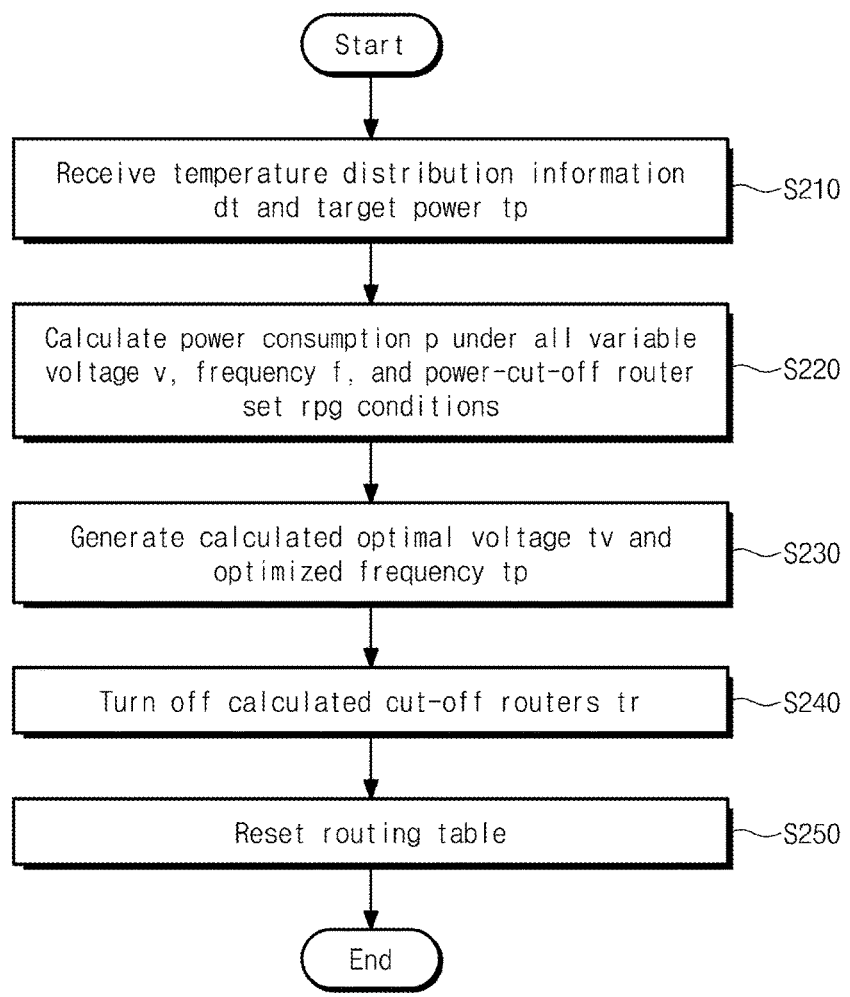
FIG. 11 is a flowchart illustrating an exemplary TEI algorithm illustrated in FIG. 10.

FIG. 11 is a flowchart illustrating an exemplary TEI algorithm illustrated in FIG. 10. Referring to FIG. 11, the controller 130 (see FIG. 7) may perform frequency scaling for power reduction or performance improvement in the detected temperature distribution.

In operation S210, the controller 130 may be provided with temperature distribution information dt and target power tp. The controller 130 may periodically receive the temperature distribution information dt from each of the routers. In addition, the controller 130 receives the magnitude of the target power tp provided from the outside or determined by itself.

In operation S220, the controller 130 performs the TEI algorithm by calculating the magnitude p of the consumed power under various power gating, voltage, and clock frequency conditions. For example, the power consumption may be calculated by varying various voltage conditions v, frequency conditions f, and various power gating conditions under given temperature distribution information dt. At this time, the over-scaling technique for increasing a frequency to one higher than a designed allowable frequency may be used.

In operation S230, the controller 130 may select a power gating, a voltage, and a clock frequency, which are able to derive a power lower than the target power among the consumed powers derived through the optimization calculation. Then, the controller 130 will select a condition corresponding to the optimal performance or power characteristic from the selected power gating condition, and voltage and clock frequency conditions.

In operation S240, the controller 130 will turn off the routers corresponding to the selected power gating condition. That is, the controller 130 will output the power gating control signal PGS to turn off the power gating switch PGS of the routers to be turned off.

In operation S250, the controller 130 updates a routing table for storing the power gating condition, voltage, and clock frequency of the routers to the currently set conditions.

The procedure of the TEI algorithm performed on the controller 130 is exemplified above. However, it will be understood well that the TEI algorithm is not limited to the above example, and that various options between the power consumption and frequency of the NoC are adjustable.

FIG. 12 is a view illustrating a PGFOS algorithm for reducing the power consumption of an NoC using the TEI phenomenon of the inventive concept. Referring to FIG. 12, the most basic procedure TEI_NOC_BASIC of the PGFOS algorithm using the TEI phenomenon performed in the controller of the present invention is shown. Although the voltage scaling procedure is described in the PGFOS algorithm, the inventive concept does not need to consider voltage scaling.

The definitions of variables are described in lines 2 to 6 of the algorithm. The variable 'tv' is a target supply voltage, the variable 'tf' is a target clock frequency, the variable 'tr' is a set of target routers to be turned off, the variable 'tri' is target router information, and the variable 'tp' is target power. When the algorithm starts to be driven, the controller 130 may receive the temperature distribution information dt and the target power tp from each of the routers. Such an operation is shown in line 8 and line 9.

Next, an iteration statement for calculating conditions for minimizing the power consumption of an NoC in the current temperature distribution information dt is shown in lines 10 to 19. Here, the setting of voltage scaling, power gating, and frequency scaling for implementing the minimum power without performance degradation under a given temperature condition may be determined.

Each of the iteration statements basically executes a minimum power function 'FIND_A_SOLUTION (dt, v, f, rpg)' that finds the optimal condition in order for implementing the minimum power with respect to all voltage scaling conditions, frequency scaling conditions, and power gating conditions. The operation of the minimum power function 'FIND_A_SOLUTION (dt, v, f, rpg)' is described in detail in lines 25 to 45. A voltage V, a frequency f, a router set rpg, routing information ri, and power consumption p, which are calculated through the minimum power function 'FIND_A_SOLUTION (dt, v, f, rpg), may be determined as the target values tv, tf, tr, tri, and tp described above.

When the target values tv, tf, tr, tri, and tp are determined, the voltage v and the frequency f provided to the routers are set to the target voltage tv and the target frequency tf. The setting of such a voltage and frequency may be performed in the power or clock domain unit as described above. Such an operation is described in line 20.

Next, the controller 130 will cut off the power gating switch of the routers corresponding to the router set rpg to be turned off. And the controller 130 will update the routing table with the target routing information tri. Such an operation is shown in line 21 and line 22.

The minimum power function 'FIND_A_SOLUTION (dt, v, f, rpg)' for guaranteeing the minimum power described in lines 25 to 45 includes a function 'FIND_ROUTING_PATHS (rpg)' for finding the optimal routing path at a frequency (f) higher than the maximum clock frequency fmax of the router defined at the time of designing. The function 'FIND_ROUTING_PATHS (rpg)' for finding the optimal routing path will be described later with reference to FIG. 13.

The PGFOS algorithm of the inventive concept for achieving minimum power using the TEI phenomenon of the inventive concept is briefly described above. Here, although the voltage scaling operation is also described, the inventive concept may effectively achieve the low power consumption of the NoC even in the case where the voltage scaling operation is accompanied or not.

FIG. 13 is a view exemplarily illustrating an operation of the function 'FIND_ROUTING_PATHS (rpg)' for finding the optimal routing path mentioned with reference to FIG. 12. Referring to FIG. 13, it is an algorithm for determining a path from a source node to a target node by avoiding turned-off routers and setting the routers. This algorithm will be referred to as a configurable routing algorithm.

The definitions of variables are described in lines 2 to 4. The variable 'rpg' indicates a set of routers to be turned off, the variable 'b' indicates feasibility, and the variable 'ri' indicates information of routers.

Lines 7 to line 12 describe the repeated operation when the function 'FIND_ROUTING_PATHS (rpg)' is called. A single path search function 'FIND_SINGLE_PATH (rpg, nodesrc, nodetgt)' is called to find a single path formed between all the source nodes nodesrc and all the target nodes nodetgt. The path found by the single path search function 'FIND_SINGLE_PATH (rpg, nodesrc, nodetgt)' is collected and combined as routing information ri. And an implementable routing path having a relatively small size among many candidate paths may be selected as an optimal routing path.

According to the above-described configurable routing algorithm, the routing path may be determined in consideration of the number of virtual channels so as to avoid deadlock. Then, the operation of the router will be set according to the determined route. The above-described configurable routing is an example using a dynamic programming technique.

FIG. 14 is a view illustrating another PGFOS algorithm for reducing the power consumption of an NoC using the TEI phenomenon. Exponential time is theoretically required depending on the size of a variable in order to execute the algorithm of FIG. 12, so that there may be a practical issue. According to the general chip temperature distribution, the middle part of the chip is higher in temperature than the edge part. Then, it is known that turning off the edge router may further reduce a path length than turning off the router located at the middle of an NoC. If using this fact, it is possible to optimize the PGFOS algorithm to select the cold edge routers first rather than arbitrarily selecting routers to be turned off. According to such an optimized PGFOS algorithm, an algorithm may be a polynomial time algorithm to increase the implementation possibility.

In the optimized PGFOS algorithm, the variable 'listr' is added to the algorithm of FIG. 12. The variable 'listr' refers to the location of the routers at the edge part of the chip. That is, this means that when the position of a router during power gating is at the edge part of a chip, the router may be turned off preferentially.

The optimized PGFOS algorithm of the inventive concept for achieving minimum power using the TEI phenomenon of the inventive concept is briefly described above. Here, although the voltage scaling operation is also described, the inventive concept may effectively achieve the low power consumption of the NoC even in the case where the voltage scaling operation is accompanied or not.

According to the present invention, it is possible to set the NoC so as to reduce the power of another region by the benefit of the speed occurring in a region where the TEI phenomenon occurs. Therefore, power consumption may be reduced while maintaining the performance of an NoC.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A network-on-chip (NoC) comprising:
a plurality of routers configured to receive power through each corresponding power gating switch; and
a controller configured to control a power gating switch of each of the plurality of routers based on temperature information provided from each of the plurality of routers and control a driving clock of the plurality of routers,
wherein the controller controls the power gating switch to turn off at least one first router by referring to the temperature information and over-scale a clock frequency of at least one turned-on second router,
wherein the over-scaled clock frequency is higher than a design maximum frequency of the at least one second router.

2. The NoC of claim 1, wherein the over-scaled clock frequency is determined with a value for providing a performance to execute a function of the at least one first router based on a temperature-effect-inversion phenomenon that a signal delay is reduced as a temperature increases.

3. The NoC of claim 1, wherein each of the plurality of routers comprises a temperature sensor for providing the temperature information.

4. The NoC of claim 1, wherein the plurality of routers comprise a Fin Field Effect Transistor (FinFET) or a transistor driven at a Ultra Low Voltage (ULV) of 1 V or less.

5. The NoC of claim 1, wherein the controller is connected to any one of the plurality of routers, and is separately provided from a node connected to the any one router.

6. The NoC of claim 1, wherein the controller is loaded to a node connected to any one router among the plurality of routers as software for controlling the power gate and a frequency of the driving clock.

7. The NoC of claim 1, wherein the controller comprises:
a temperature condition monitor configured to monitor the temperature information;
a router performance monitor configured to monitor a performance of each of the plurality of routers; and
an optimization unit configured to determine the power gating switch and a frequency of the driving clock by referring to the temperature information and the performance.

8. The NoC of claim 7, wherein the optimization unit performs an adjustment to allow the at least one turned-on second router to configure an optimal signal path.

9. The NoC of claim 7, wherein the optimization unit performs voltage scaling to adjust a level of driving voltage provided to the plurality of routers.

10. The NoC of claim 9, wherein the optimization unit controls a frequency of the driving clock in a frequency domain unit and performs the voltage scaling in a power domain unit.

11. The NoC of claim 7, wherein the controller further comprises:
a power gate control unit configured to turn off a power gating switch of the at least one first router and turn on a power gating switch of the at least one second router according to a control of the optimization unit; and
a frequency control unit configured to control a frequency of the driving clock.

12. An operation method of a network-on-chip (NoC), the method comprising:
detecting a temperature of a plurality of routers in the NoC;
determining routers to be turned off among the plurality of routers to reduce power consumption based on the detected temperature; and
over-scaling a clock frequency of turned-on routers among the plurality of routers to be higher than a value of a design maximum frequency based on the detected temperature,
wherein the plurality of routers comprise a circuit element whose signal delay is reduced as a temperature increases.

13. The method of claim 12, further comprising performing configurable routing for determining an optimal routing path between the turned-on routers.

14. The method of claim 12, wherein a magnitude of the over-scaled frequency is determined according to the number of the routers to be turned off.

15. The method of claim 12, further comprising adjusting a level of driving voltage provided to each of the plurality of routers based on the detected temperature.

16. The method of claim 12, further comprising determining whether the detected temperature is in a level of applying a temperature-effect-inversion phenomenon.

17. The method of claim 12, wherein the determining of the routers to be turned off comprises preferentially selecting routers at a distance from a center of the NoC.

* * * * *